United States Patent
Huang

(10) Patent No.: US 8,570,817 B2
(45) Date of Patent: Oct. 29, 2013

(54) DATA INPUT DEVICE FOR SEMICONDUCTOR MEMORY DEVICE

(75) Inventor: Ming-Chien Huang, Banqiao (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 81 days.

(21) Appl. No.: 13/451,824

(22) Filed: Apr. 20, 2012

(65) Prior Publication Data

US 2012/0269008 A1 Oct. 25, 2012

Related U.S. Application Data

(60) Provisional application No. 61/457,570, filed on Apr. 22, 2011.

(51) Int. Cl.
*G11C 7/00* (2006.01)
*G11C 7/10* (2006.01)

(52) U.S. Cl.
USPC ............ 365/189.16; 365/189.05; 365/189.08; 365/191; 365/193; 365/194

(58) Field of Classification Search
USPC .............................. 365/189.08, 191, 193, 194
See application file for complete search history.

(56) References Cited

U.S. PATENT DOCUMENTS

| | | | |
|---|---|---|---|
| 6,292,410 B1* | 9/2001 | Yi et al. | 365/189.15 |
| 7,016,237 B2* | 3/2006 | Lee et al. | 365/189.05 |
| 2006/0007757 A1* | 1/2006 | Mukherjee et al. | 365/193 |
| 2007/0002644 A1* | 1/2007 | Kang | 365/193 |
| 2008/0089167 A1* | 4/2008 | Dono | 365/233.5 |

* cited by examiner

*Primary Examiner* — Ly D Pham
(74) *Attorney, Agent, or Firm* — Stites & Harbison PLLC; Juan Carlos A. Marquez, Esq.

(57) ABSTRACT

A data input device for use in a memory device to avoid false data being written due to a postamble ringing phenomenon in a write operation is provided. The data input device comprises a buffer, a combinational logic circuit and a flip-flop unit. The buffer receives the data and outputs internal data to the flip-flop unit. The combinational logic circuit receives an external data strobe signal to generate a first data strobe signal and a second data strobe signal. The flip-flop unit stores the data in synchronization with the first data strobe signal and outputs the stored data in synchronization with the second data strobe signal. A last rising edge of the second data strobe signal is generated prior to onset of the postamble ringing on the external data strobe signal, so that a data transferred path in the flip-flop unit is closed prior to onset of the postamble ringing.

11 Claims, 7 Drawing Sheets

DATA INPUT DEVICE FOR SEMICONDUCTOR MEMORY DEVICE

RELATED APPLICATION

The present invention claims the benefit of U.S. Provisional Application Ser. No. 61/457,570 entitled "Avoiding Write Postamble Noise in DRAM" and filed Apr. 22, 2011.

BACKGROUND OF THE INVENTION

1. Field of the Invention

The present invention relates to a data input device for use in a memory device to avoid false data being written due to a postamble ringing phenomenon in a write operation.

2. Description of the Related Art

Semiconductor memory devices are widely used in many electronic products and computer systems to store and retrieve data. Presently, semiconductor memory devices have become highly integrated and operate at higher speed to improve system performance. In order to enhance the operation speed of the semiconductor devices, a double data rate synchronous dynamic random access memory (DDR SDRAM) device has been developed to provide twice the operation speed of a conventional synchronous memory device. The DDR SDRAM allows data transfers on both the rising and falling edges of the system clock, and thus provides twice as much data as the conventional synchronous memory device.

As is known to one skilled in the art, the DDR SDRAM adopts a 2-bit prefetch operation to output 2-bit data to a data pad during one clock cycle. In order to prefetch more data bits, a DDR2 SDRAM and a DDR3 SDRAM have been developed. The DDR2 SDRAM adopts a 4-bit prefetch operation to output 4-bit data to a data pad during two clock cycles, and the DDR3 SDRAM adopts an 8-bit prefetch operation to output 8-bit data to a data pad during four clock cycles. As such, the data transfer rate of the DDR2 SDRAM and DDR3 SDRAM is improved by increasing the number of the prefetch bits.

In order to realize precise timing for data input/output during a high-speed operation in DDR SDRAMs including DDR2 SDRAM and DDR3 SDRAM, a data strobe signal XDQS, which is center aligned with a data input signal XDQ, is applied from a central processor or a memory controller to the memory device. FIG. 1 is a block diagram of a prior art data input section in a DDR2 SDRAM. The block diagram includes flip-flops 10, 12, and 14, and buffers 16 and 18. The buffer 16 as a data input buffer receives and buffers a data input signal XDQ, and the DQS buffer 18 receives and buffers a data strobe signal XDQS for use within the DDR2 SDRAM. The buffered strobe signal XDQS is designated as the signal DQS, which is used to "clock in" or "strobe" data bits to be written into the memory cells (not shown).

FIG. 2 is a timing diagram illustrating a general write operation of the data input section of FIG. 1. Referring to both FIGS. 1 and 2, a "write" command is issued in synchronization with an external clock signal XCLK applied from a memory controller (not shown). After a predetermined time, the external data strobe signal XDQS is applied to the buffer 18 to generate an internal strobe signal DQS. The strobe signal DQS is delayed or phase-shifted by the buffer 18 as shown in FIG. 2. Data bits D0, D1, D2, and D3 in the data signal XDQ are serially inputted to the buffer 16. Thereafter, the flip-flop 10 receives internal data IDQ sequentially output one-bit by one-bit from the buffer 16 and outputs a signal N1 in synchronization with a rising edge of the strobe signal DQS.

Thereafter, the flip-flop 14 receives the signal N1 and provides data bit D0 to the memory cell in synchronization with a falling edge of the strobe signal DQS. Similarly, the flip-flop 12 receives the internal data IDQ from the data buffer 16 and provides data bit D1 to the memory cell in synchronization with a falling edge of the strobe signal DQS.

After finishing the write operation, the external data strobe signal XDQS enters a tri-stage condition after the completion of a postamble time 20. After the postamble time 20, the state of XDQS is no longer guaranteed and a ringing may start. Such ringing on the strobe signal XDQS may cause false data to be written into the memory cells because the postamble ring may be incorrectly recognized by the flip-flops as valid data clocking edges of the strobe signal DQS.

In order to avoid false data being written because of the postamble ringing phenomenon in the write operation in the DDR SDRAM, there is a need to provide a method and an apparatus to solve the above-described problem.

SUMMARY OF THE INVENTION

One aspect of the present invention is to provide a data input device for use in a memory device to avoid false data being written due to a postamble ringing phenomenon in a write operation.

According to one embodiment of the present invention, the data input device comprises a buffer, a combinational logic circuit, and a flip-flop unit. The combinational logic circuit receives an external data strobe signal and outputs a first data strobe signal and a second data strobe signal in response to the external data strobe signal. The buffer receives the data and outputs internal data to the flip-flop unit. The flip-flop unit stores the data in synchronization with the first data strobe signal and outputs the stored data in synchronization with the second data strobe signal. The first data strobe signal is generated by delaying the external data strobe signal for a first predetermined time. A last falling edge of the second data strobe signal is generated by delaying a last falling edge of the first data strobe signal for a second predetermined time, and a last rising edge of the second data strobe signal, which follows the last falling edge of the second strobe signal, is generated by delaying the last falling edge of the second data strobe signal for a third predetermined time. The last rising edge of the second data strobe signal is generated prior to onset of a postamble ringing on the external data strobe signal.

Another aspect of the present invention is to provide a method of writing data into a memory device to avoid false data being written due to a postamble ringing phenomenon in a write operation.

According to another embodiment of the present invention, the method comprises receiving the data and an external data strobe signal from a memory controller; delaying the external strobe signal for a first predetermined time to generate a first data strobe signal; generating a second data strobe signal in response to the first data strobe signal, wherein a second predetermined time is between a last falling edge of the second data strobe signal and a last falling edge of the first data strobe signal, and a third predetermined time is between a last rising edge of the second data strobe signal and the last falling edge of the second data strobe signal; writing the received data into the memory device in synchronization with the second data strobe signal; and closing a data transferred path in response to the last rising edge of the second data strobe signal; wherein the last rising edge of the second data strobe signal is generated prior to onset of the postamble ringing on the external data strobe signal.

BRIEF DESCRIPTION OF THE DRAWINGS

The invention will be described according to the appended drawings in which.

DETAILED DESCRIPTION OF THE INVENTION

Figure 1:
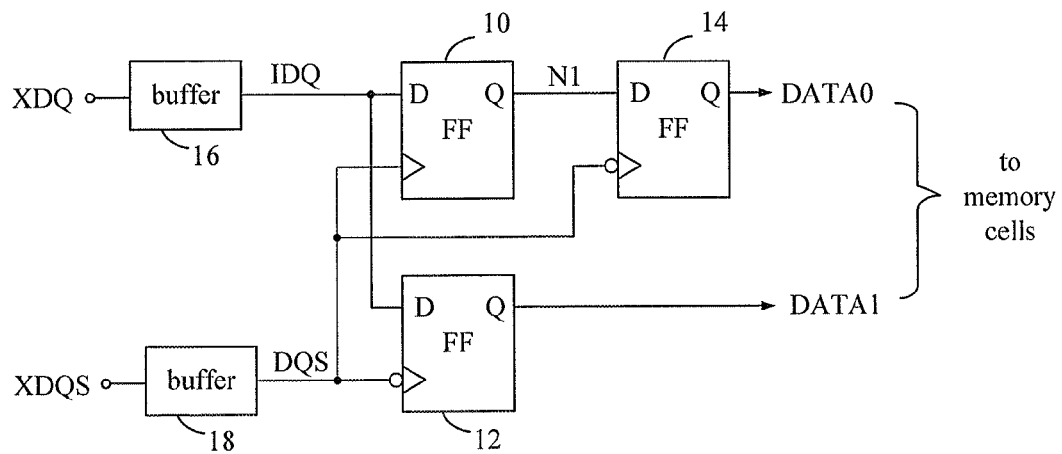
FIG. 1 is a block diagram of a prior art data input section in a DDR2 SDRAM.
Figure 2:
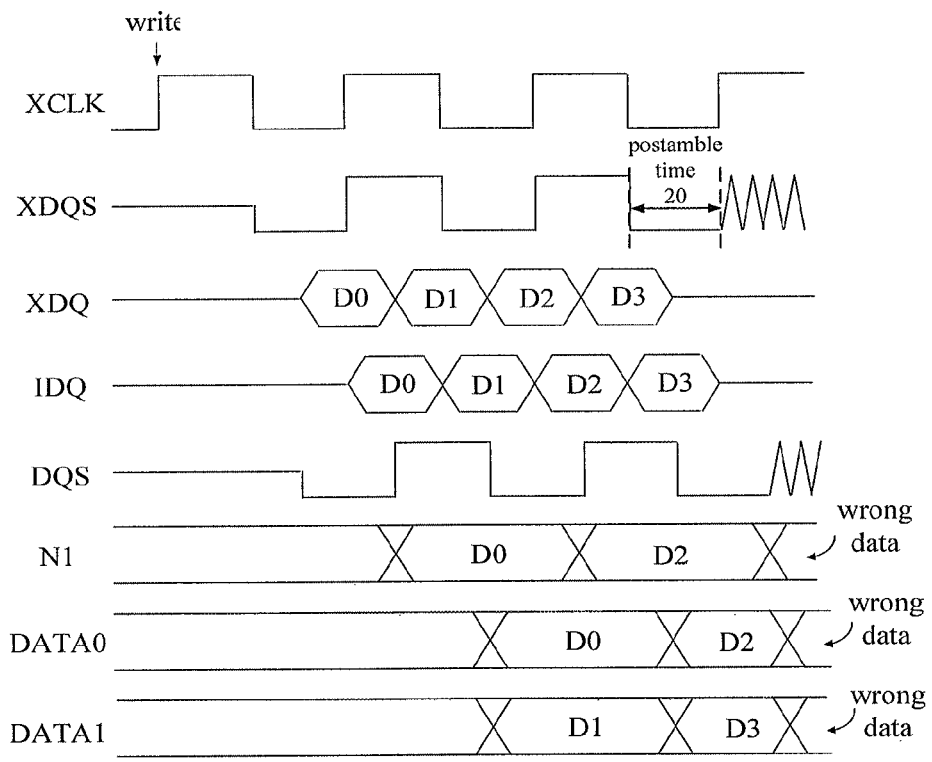
FIG. 2 is a timing diagram illustrating a general write operation of the data input section of FIG. 1.
Figure 3:
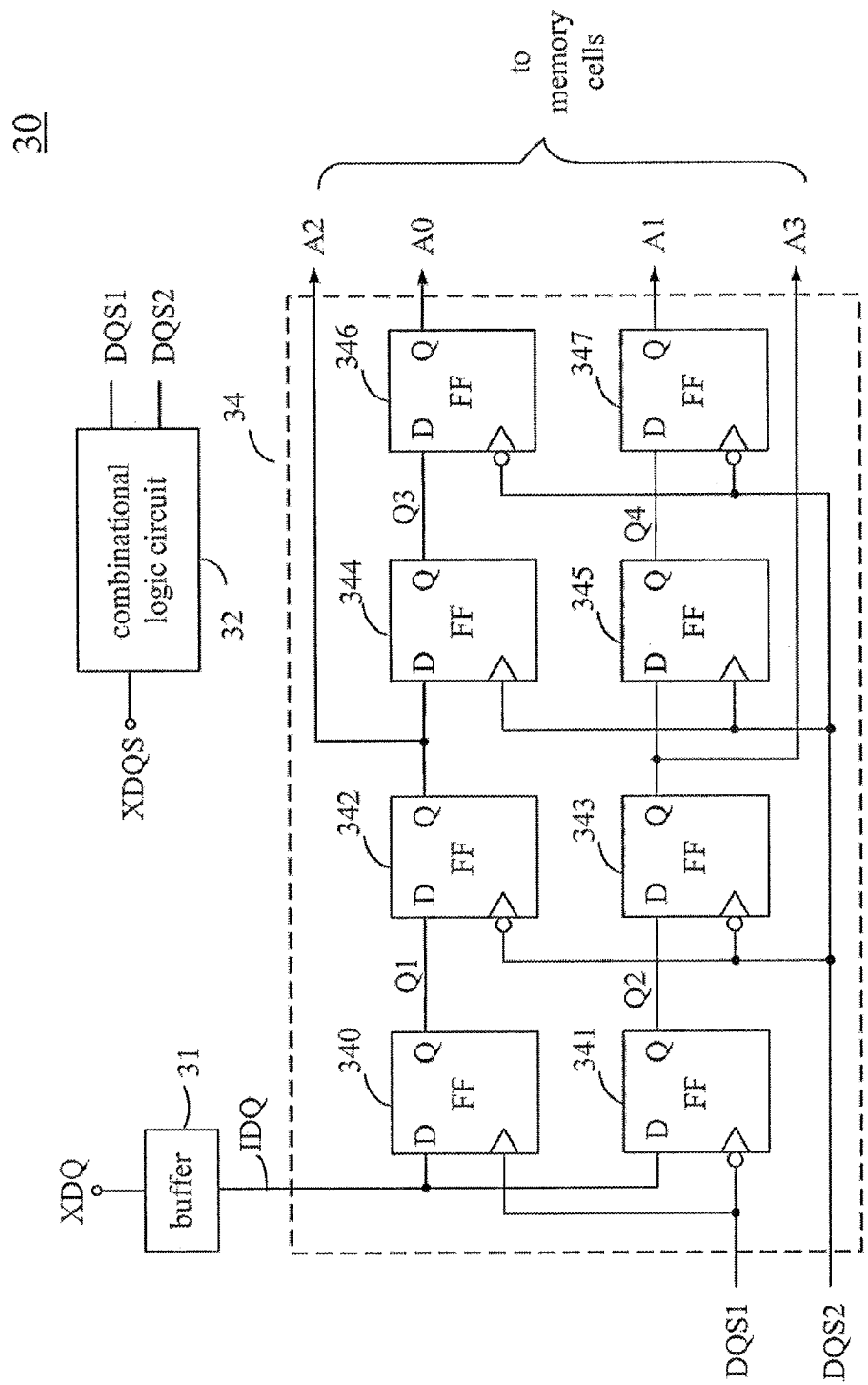
FIG. 3 is a block diagram of a data input section to avoid invalid data being written by a postamble ringing phenomenon in a memory device, according to one embodiment of the present invention.

FIG. 3 is a block diagram of a data input section 30 to avoid invalid data being written by a postamble ringing phenomenon in a memory device, according to one embodiment of the present invention. Referring to FIG. 3, the data input section 30 includes a buffer 31, a combinational logic circuit 32 and a flip-flop unit 34. The buffer 31 as a data input buffer receives a data input signal XDQ and outputs the received data as internal data IDQ. In this case, the data input signal XDQ is comprised of 4 data bits D0, D1, D2, and D3. The combinational logic circuit 32 receives a data strobe signal XDQS from a memory controller (not shown) and outputs different data strobe signals DQS1 and DQS2 in response to the strobe signal XDQS. The data strobe signals DQS1 and DQS2 are then provided to the flip-flop unit 34 to store data bits to be written into the memory cells. The flip-flop unit 34 receives the internal data IDQ from the buffer 31. Thereafter, the flip-flop unit 34 stores the data bits in synchronization with the first data strobe signal DQS1 and outputs the stored data in synchronization with the data strobe signal DQS2.

Referring to FIG. 3, the flip-flop unit 34 includes flip-flops 340, 341, 342, 343, 344, 345, 346, and 347. The flip-flop unit 34 stores the data bits in a two-row parallel form through the flip-flops 340-347 activated in response to the data strobe signals DQS1 and DQS2. The flip-flop 340 stores the internal data IDQ in synchronization with the rising edges of the strobe signal DQS1. The flip-flop 341 stores the internal data IDQ in synchronization with the falling edges of the strobe signal DQS1. The flip-flop 342 stores data Q1 from the flip-flop 340 and outputs the stored data as output data A2 in synchronization with the falling edges of the strobe signal DQS2. The flip-flop 343 stores data Q2 from the flip-flop 341 and outputs the stored data as output data A3 in synchronization with the falling edges of the strobe signal DQS2. The flip-flop 344 stores the output data A2 and outputs the stored data in synchronization with the rising edges of the strobe signal DQS2. The flip-flop 345 stores the output data A3 and outputs the stored data in synchronization with the rising edges of the strobe signal DQS2. The flip-flop 346 stores data Q3 from the flip-flop 344 and outputs the stored data as output data A0 in synchronization with the falling edges of the strobe signal DQS2. The flip-flop 347 stores data Q4 from the flip-flop 345 and outputs the stored data as output data A1 in synchronization with the falling edges of the strobe signal DQS2.

Figure 4:
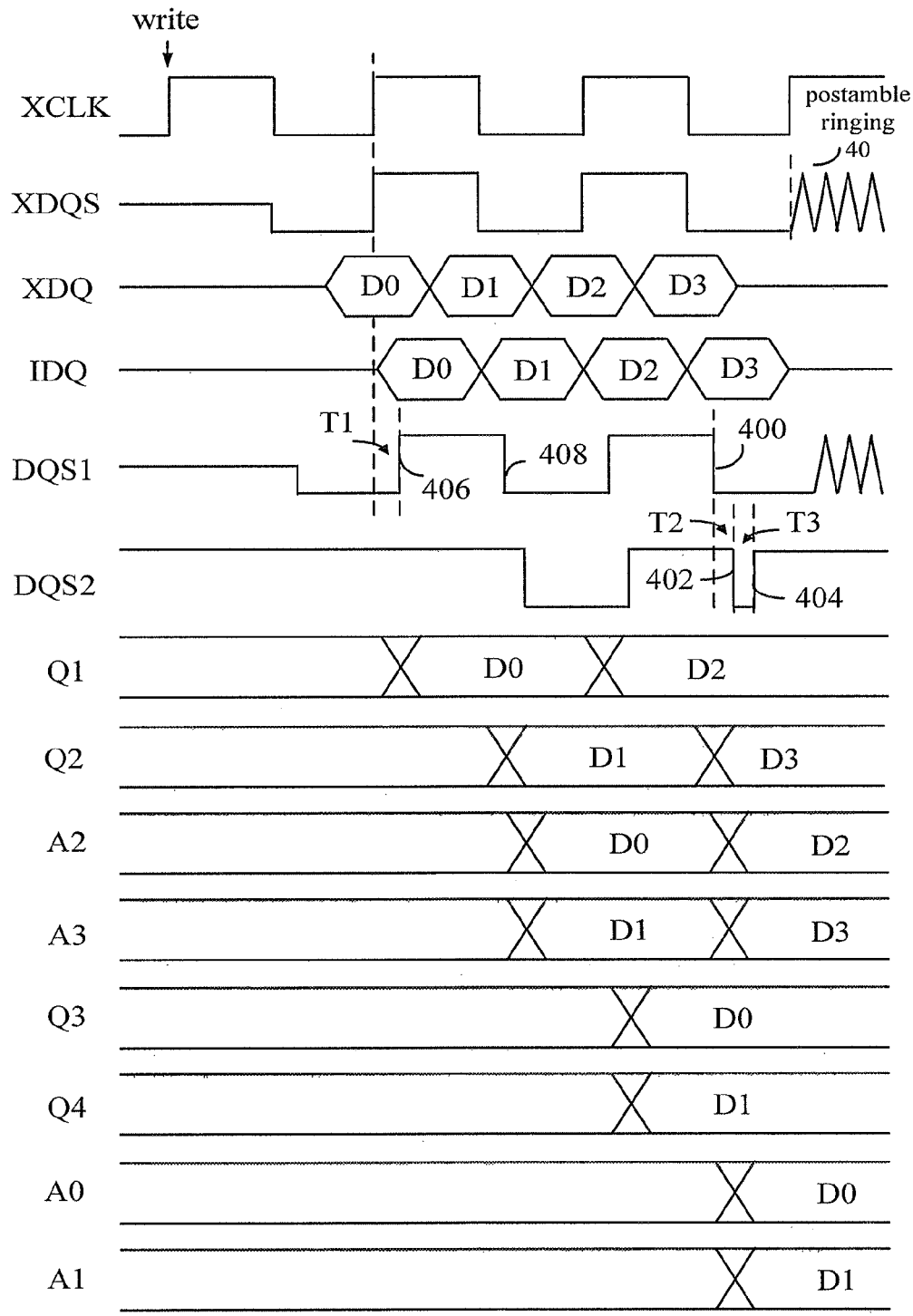
FIG. 4 is a timing diagram illustrating an operation of the data input section of FIG. 3.

FIG. 4 is a timing diagram illustrating an operation of the data input section 30 of FIG. 3. The timing diagram includes an external data input signal XDQ, an external data strobe signal XDQS, and internal data signal IDQ, internal data strobe signals DQS1, DQS2, and output data Q1, Q2, Q3, Q4, A0, A1, A2, A3. Referring to FIG. 4, external signals XDQ and XDQS are center aligned. That is, rising and falling edges of the signal XDQS are aligned with the centers of data bits of the signal XDQ.

The external signals XDQ and XDQS are tri-stated following the last valid data bit. In the embodiment of FIG. 4, the signal XDQS is shown to be ringing as it enters the tri-stage condition. However, as discussed below, the effect of the ringing phenomenon present on XDQS can be eliminated by proper timing the strobe signal DQS2. A last rising edge 404 of the strobe signal DQS2 is generated prior to onset of a postamble ringing 40 on the XDQS so that false data cannot be written into the memory cells.

Referring to both FIGS. 3 and 4, a "write" command is issued in synchronization with an external clock signal XCLK applied from the memory controller. After a predetermined time delay, the external data strobe signal XDQS is applied to the combinational logic circuit 32 to generate internal data strobe signals DQS1 and DQS2. Referring to FIG. 4, the data strobe signal DQS1 is generated by delaying the strobe signal XDQS for a predetermined time T1 so that the buffered data IDQ can satisfy a set-up time and a hold time corresponding to the data strobe signal DQS1. A last falling edge 402 of the data strobe signal DQS2 is generated by delaying a last falling edge 400 of the data strobe signal DQS1 for a predetermined time T2. The last rising edge 404 of the strobe signal DQS2, which follows the last falling edge 402 of the strobe signal DQS2, is generated by delaying the last falling edge 402 of the data strobe signal DQS2 for a predetermined time T3. The last rising edge 404 of the data strobe signal DQS2 is generated prior to onset of the postamble ringing 40 on the data strobe signal XDQS.

Referring to both FIGS. 3 and 4, four data bits D0-D3 are fed sequentially into the buffer 31 and are sequentially output one-bit by one-bit from the buffer 31. The flip-flop unit 34 stores the buffered data IDQ through the internal flip-flops 340 and 341 in response to the data strobe signal DQS1. In this embodiment, the flip-flop 340 stores a first data bit D0 in synchronization with a first rising edge 406 of the data strobe signal DQS1, and the flip-flop 341 stores a second data bit D1 in synchronization with a first falling edge 408 of the data strobe signal DQS1. Thereafter, the stored data bits are transferred sequentially one-bit by one-bit through the flip-flops 342-347. Eventually, the flip-flop unit 34 outputs the data bits D0-D3 in synchronization with the last falling edge 402 of the data strobe signal DQS2, and thus the data bits D0-D3 can be written into the memory cells in parallel.

Referring to FIG. 4, the last rising edge 404 of the data strobe signal DQS2 is generated prior to onset of the postamble ringing 40 on the data strobe signal XDQS. Therefore, a data transferred path in the flip-flop unit 34 is closed prior to onset of the postamble ringing 40 since the flip-flops 342, 343, 346, and 347 cannot be triggered accidentally by the postamble ringing. As a result, false data may not be written into the memory cells due to the postamble ringing.

Figure 5:
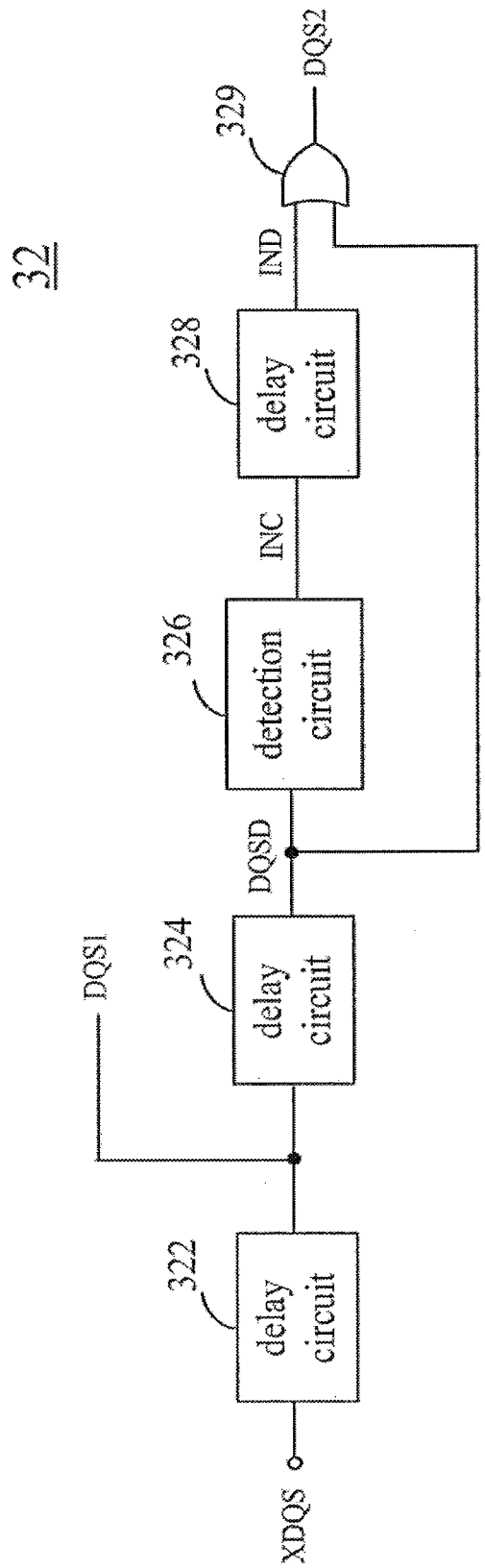
FIG. 5 is a block diagram of the combinational logic circuit according to one embodiment of the present invention.
Figure 6:
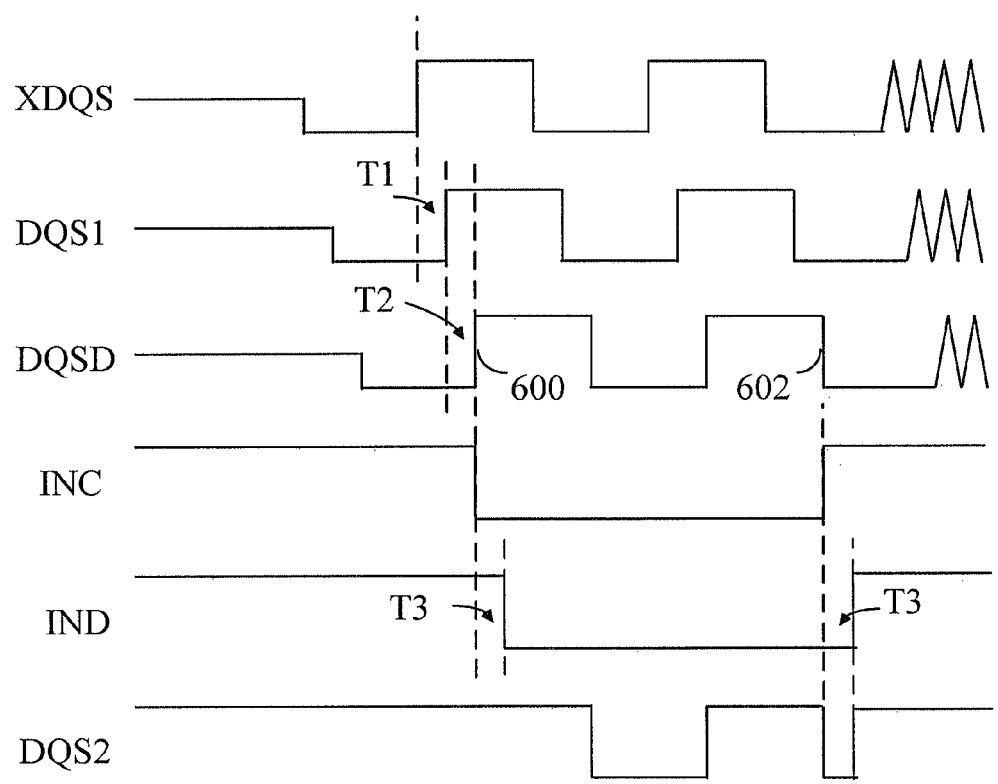
FIG. 6 is a timing diagram illustrating an operation of the combinational logic circuit of FIG. 5.

FIG. 5 is a block diagram of the combinational logic circuit 32 according to one embodiment of the present invention. Referring to FIG. 5, the combinational logic circuit 32 includes a first delay circuit 322, a second delay circuit 324, a detection circuit 326, a third delay circuit 328, and an OR gate 329. FIG. 6 is a timing diagram illustrating an operation of the combinational logic circuit 32 of FIG. 5. Referring to FIG. 5 and FIG. 6, the operation of the combinational logic circuit 32 is described below.

The first delay circuit 322 receives the external data strobe signal XDQS. Thereafter, the first delay circuit 322 generates the strobe signal DQS1 by delaying the strobe signal XDQS for the predetermined time T1. Upon receiving the strobe signal DQS1, the second delay circuit 324 generates a delayed signal DQSD by delaying the strobe signal DQS1 for the predetermined time T2.

Thereafter, the detection circuit 326 detects a first rising edge 600 and a last falling edge 602 of the delayed signal DQSD to generate an indication signal INC. Upon receiving the indication signal INC, the third delay circuit 328 generates a delayed signal IND by delaying the indication signal INC for the predetermined time T3. Thereafter, the OR gate 329 receives the delayed signal IND and the delayed signal DQSD to generate the strobe signal DQS2.

Figure 7:
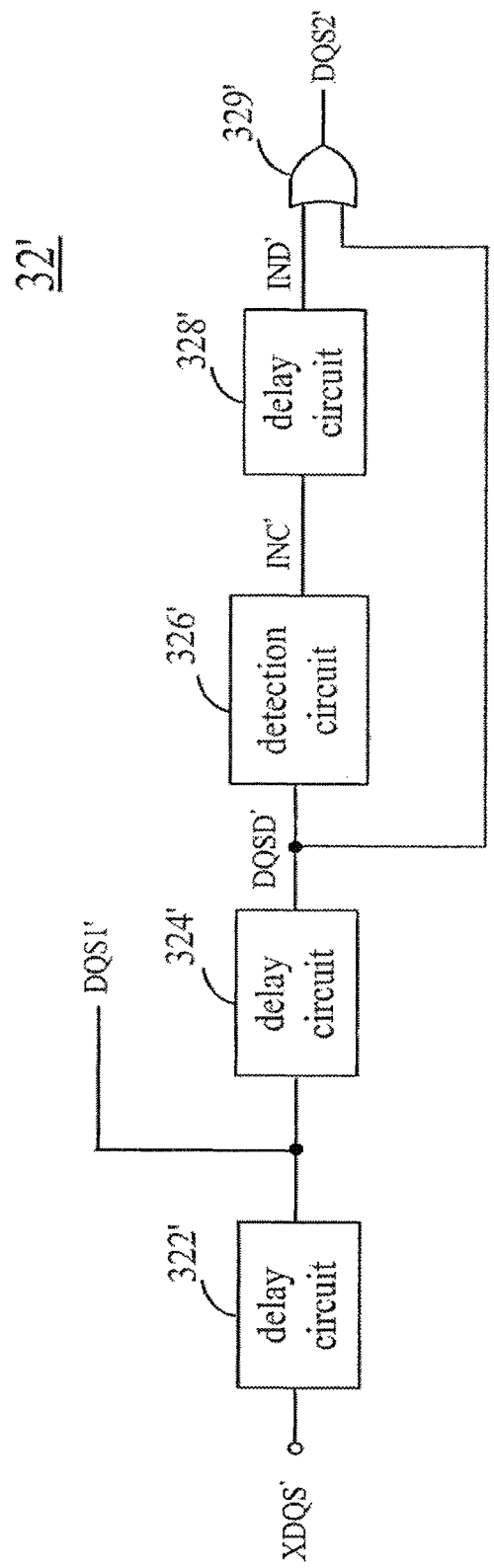
FIG. 7 is a block diagram of the combinational logic circuit in the DDR3 SDRAM according to one embodiment of the present invention.
Figure 8:
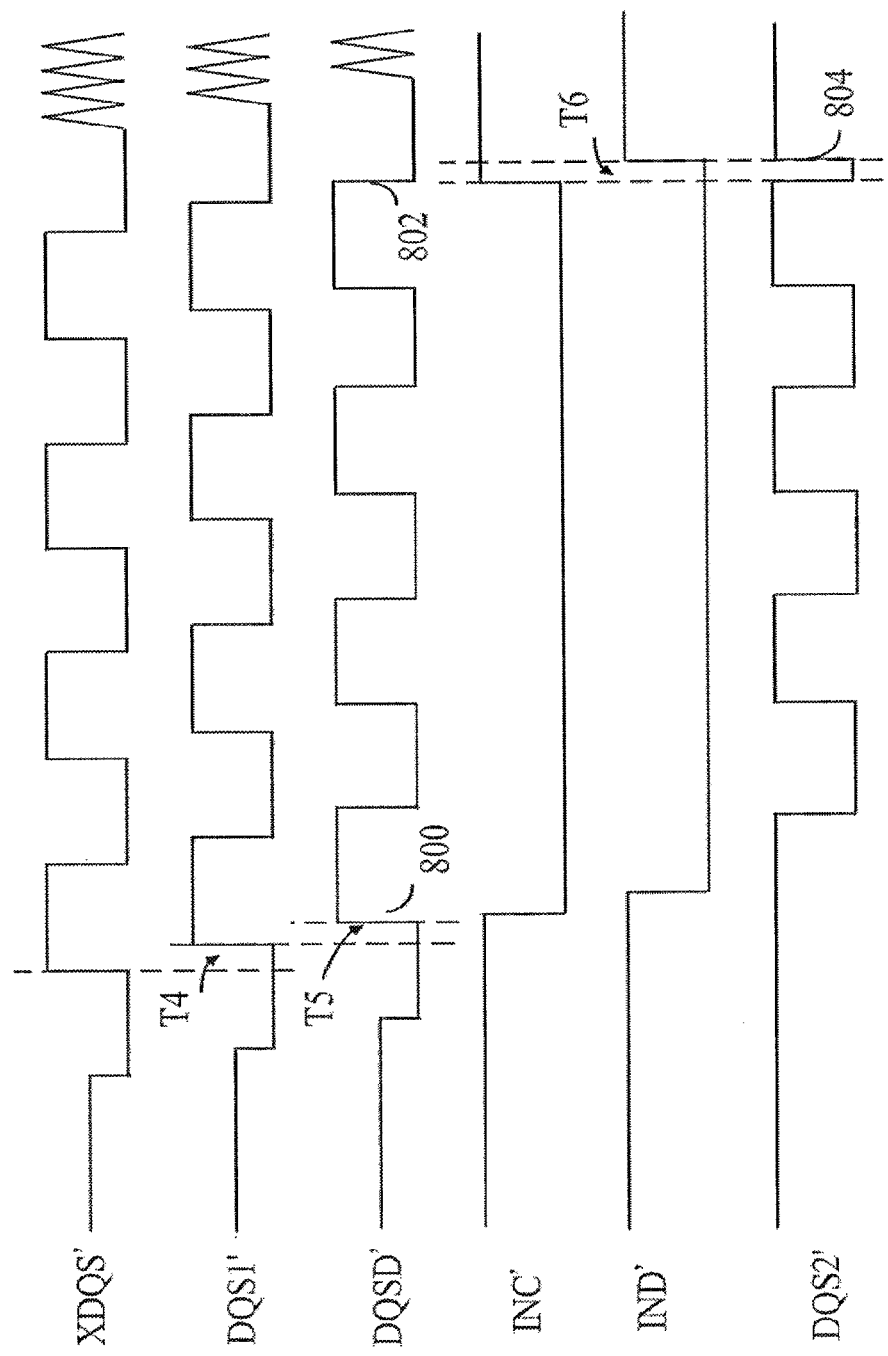
FIG. 8 is a timing diagram illustrating an operation of the combinational logic circuit of FIG. 7.

In the above embodiments, the invention is applied to a DDR2 SDRAM; however, the invention can also be applied to a DDR SDRAM or a DDR3 SDRAM. FIG. 7 is a block diagram of the combinational logic circuit 32' in the DDR3 SDRAM according to one embodiment of the present invention. Referring to FIG. 7, the combinational logic circuit 32' includes a first delay circuit 322', a second delay circuit 324', a detection circuit 326', a third delay circuit 328', and an OR gate 329'. FIG. 8 is a timing diagram illustrating an operation of the combinational logic circuit 32' of FIG. 7. Referring to FIG. 7 and FIG. 8, the operation of the combinational logic circuit 32' in the DDR3 SDRAM is described below.

The first delay circuit 322' receives an external data strobe signal XDQS' from a memory controller. Thereafter, the first delay circuit 322' generates a data strobe signal DQS1' by delaying the strobe signal XDQS' for a predetermined time T4. Upon receiving the strobe signal DQS1', the second delay circuit 324' generates a delayed signal DQSD' by delaying the strobe signal DQS1' for the predetermined time T5.

Thereafter, the detection circuit 326' detects a first rising edge 800 and a last falling edge 802 of the delayed signal DQSD' to generate an indication signal INC'. Upon receiving the indication signal INC', the second delay circuit 328' generates a delayed signal IND' by delaying the indication signal INC' for the predetermined time T6. Thereafter, the OR gate 329' receives the delayed signal IND' and the delayed signal DQSD' to generate the strobe signal DQS2'.

Therefore, in accordance with the above embodiment of the present invention, the last rising edge 804 of the data strobe signal DQS2 is generated prior to onset of the postamble ringing 40 on the data strobe signal XDQS. In this manner, flip-flops within the memory device will not be triggered accidentally by the postamble ringing, and thus false data may not be written into the memory cells because of postamble ringing.

The above-described embodiments of the present invention are intended to be illustrative only. Numerous alternative embodiments may be devised by those skilled in the art without departing from the scope of the following claims.

What is claimed is:

1. A data input device for writing data into a memory device, comprising:

a combinational logic circuit for receiving an external data strobe signal and for outputting a first data strobe signal and a second data strobe signal in response to the external data strobe signal;

a buffer for receiving the data and for outputting internal data to a flip-flop unit; and the flip-flop unit for storing the internal data in synchronization with the first data strobe signal and for outputting the stored data in synchronization with the second data strobe signal;

wherein the first data strobe signal is generated by delaying the external data strobe signal for a first predetermined time;

wherein a last falling edge of the second data strobe signal is generated by delaying a last falling edge of the first data strobe signal for a second predetermined time, and a last rising edge of the second data strobe signal, which follows the last falling edge of the second strobe signal, is generated by delaying the last falling edge of the second data strobe signal for a third predetermined time; and wherein the last rising edge of the second data strobe signal is generated prior to onset of a postamble ringing on the external data strobe signal.

2. The data input device of claim 1, wherein the flip-flop unit comprises:

a first flip-flop for storing the internal data in synchronization with the rising edges of the first data strobe signal;

a second flip-flop for storing the internal data in synchronization with the falling edges of the first data strobe signal;

a third flip-flop for storing data from the first flip-flop and for outputting the stored data as first output data in synchronization with the falling edges of the second data strobe signal;

a fourth flip-flop for storing data from the second flip-flop and for outputting the stored data as second output data in synchronization with the falling edges of the second data strobe signal;

a fifth flip-flop for storing the first output data and for outputting the stored data in synchronization with the rising edges of the second data strobe signal;

a sixth flip-flop for storing the second output data and for outputting the stored data in synchronization with the rising edges of the second data strobe signal;

a seventh flip-flop for storing data from the fifth flip-flop and for outputting the stored data as third output data in synchronization with the falling edges of the second data strobe signal; and an eighth flip-flop for storing data from the sixth flip-flop and for outputting the stored data as fourth output data in synchronization with the falling edges of the second data strobe signal.

3. The data input device of claim 1, wherein the combinational logic circuit comprises:

a first delay circuit for receiving the external data strobe signal and for generating the first data strobe signal by delaying the external data strobe signal for the first predetermined time;

a second delay circuit for receiving the first data strobe signal and for generating a first delayed signal by delaying the first data strobe signal for the second predetermined time;

a detection circuit for detecting a first rising edge and a last falling edge of the first delayed signal and for generating an indication signal;

a third delay circuit for receiving the indication signal and for generating a second delayed signal by delaying the indication signal for the third predetermined time; and an OR gate for receiving the first delayed signal and the second delayed signal and for generating the second data strobe signal.

4. The data input device of claim 1, wherein the memory device is a DDR2 SDRAM.

5. The data input device of claim 1, wherein the memory device is a DDR3 SDRAM.

6. A method of writing data into a memory device comprising:
receiving the data and an external data strobe signal from a memory controller;
delaying the external strobe signal for a first predetermined time to generate a first data strobe signal;
generating a second data strobe signal in response to the first data strobe signal, wherein a second predetermined time is between a last falling edge of the second data strobe signal and a last falling edge of the first data strobe signal, and a third predetermined time is between a last rising edge of the second data strobe signal and the last falling edge of the second data strobe signal;
writing the received data into the memory device in synchronization with the second data strobe signal; and
closing a data transferred path in response to the last rising edge of the second data strobe signal;
wherein the last rising edge of the second data strobe signal is generated prior to onset of a postamble ringing on the external data strobe signal.

7. The method of claim 6, further comprising:
storing the received data from the memory controller in synchronization with the first data strobe signal.

8. The method of claim 6, wherein the writing the received data into the memory device in synchronization with the second data strobe signal comprises:
storing a first data bit of the received data in synchronization with a first rising edge of the first data strobe signal;
storing a second data bit of the received data in synchronization with a first falling edge of the first data strobe signal; and
outputting the stored data comprising the first data bit and the second data bit in synchronization with the falling edges of the second data strobe signal.

9. The method of claim 6, wherein the generating the second data strobe signal in response to the first data strobe signal comprises:
generating a first delayed signal by delaying the first data strobe signal for the second predetermined time;
detecting a first rising edge and a last falling edge of the first delayed signal to generate an indication signal;
generating a second delayed signal by delaying the indication signal for the third predetermined time; and
receiving the first delayed signal and the second delayed signal to generate the second data strobe signal.

10. The method of claim 6, wherein the memory device is a DDR2 SDRAM.

11. The method of claim 6, wherein the memory device is a DDR3 SDRAM.

* * * * *